United States Patent [19]

Aoki et al.

[11] Patent Number: 5,338,697
[45] Date of Patent: Aug. 16, 1994

[54] DOPING METHOD OF BARRIER REGION IN SEMICONDUCTOR DEVICE

[75] Inventors: Kenji Aoki; Tadao Akamine; Naoto Saito, all of Tokyo, Japan

[73] Assignee: Seiko Instruments Inc., Tokyo, Japan

[21] Appl. No.: 620,615

[22] Filed: Dec. 3, 1990

[30] Foreign Application Priority Data

| Dec. 1, 1989 | [JP] | Japan | 1-313719 |
| Dec. 1, 1989 | [JP] | Japan | 1-313720 |
| Dec. 1, 1989 | [JP] | Japan | 1-313726 |
| Dec. 6, 1989 | [JP] | Japan | 1-318553 |
| Dec. 6, 1989 | [JP] | Japan | 1-318554 |

[51] Int. Cl.[5] ................ H01L 21/76; H01L 21/336
[52] U.S. Cl. ................ 437/40; 437/41; 437/64; 437/69; 437/160; 437/161; 437/950; 437/968; 148/DIG. 37
[58] Field of Search ............ 437/41, 44, 64, 69, 437/160, 161, 913, 950, 968, 40; 148/DIG. 34, DIG. 37, DIG. 53; 257/345, 398, 399, 400, 648, 652

[56] References Cited

U.S. PATENT DOCUMENTS

| 3,247,032 | 4/1966 | Griswold . | |
| 3,458,367 | 7/1969 | Yasufuku | 437/950 |
| 4,242,691 | 12/1980 | Kotani et al. . | |
| 4,279,671 | 7/1981 | Komatsu | 437/186 |
| 4,465,529 | 8/1984 | Arima et al. | 148/188 |
| 4,697,198 | 9/1987 | Komori et al. | 257/345 |
| 4,784,968 | 11/1988 | Komori et al. | 257/345 |
| 4,791,074 | 12/1988 | Tsunashima et al. | 437/160 |
| 4,855,258 | 8/1989 | Allman et al. | 437/241 |
| 4,861,729 | 8/1989 | Fuse et al. . | |
| 4,914,492 | 4/1990 | Matsumoto | 257/345 |
| 4,966,861 | 10/1990 | Mieno et al. | 437/939 |
| 5,089,441 | 2/1992 | Moslehi | 437/946 |
| 5,183,777 | 2/1993 | Doki et al. | 148/DIG. 34 |

FOREIGN PATENT DOCUMENTS

| 0208935 | 1/1987 | European Pat. Off. . | |
| 233791 | 8/1987 | European Pat. Off. | 437/41 |
| 316165 | 5/1989 | European Pat. Off. . | |
| 0322921 | 7/1989 | European Pat. Off. . | |
| 0413982 | 2/1991 | European Pat. Off. . | |
| 0417457 | 3/1991 | European Pat. Off. | 437/41 |
| 3208259 | 9/1982 | Fed. Rep. of Germany . | |
| 54-106180 | 8/1979 | Japan | 437/41 |
| 62-120041 | 6/1987 | Japan . | |
| 62-193178 | 8/1987 | Japan | 437/41 |
| 62-271475 | 11/1987 | Japan . | |
| 63-166220 | 7/1988 | Japan . | |
| 63-239939 | 10/1988 | Japan . | |
| 1192159 | 8/1989 | Japan . | |
| 350743 | 3/1991 | Japan | 437/41 |
| 8201380 | 10/1981 | PCT Int'l Appl. . | |
| 1384206 | 2/1975 | United Kingdom . | |
| 2065369 | 6/1981 | United Kingdom . | |

OTHER PUBLICATIONS

"UV epitaxy applied to make transistor", *Nikkei High Tech Report*, vol. 4, No. 7, Feb. 13, 1989, p. 10.

Excerpt from *Patent Abstracts of Japan*, vol. 12, No. 430, Japanese Patent No. 63-166220, Jul. 1988.

"Metal-Oxide-Silicon Field-Effect Transistor Made by Means of Solid-Phase Doping", by Gong et al; J. Appl. Phys. 65 (11), Jun. 1, 1989.

Nishizawam, Jun-ichi, "Simple-Structure PMOSFET Fabricated Using Molecular Layer Doping", 8179 IEEE Electron Device Letters, Mar. 11, 1990, pp. 105–106.

Leung, D. L., et al., "CMOS Devices Fabricated in Thin Epitaxial Silicon On Oxide", 1989 IEEE SOS/-SOI Technology Conference, Oct., 1989, pp. 74–75.

Nikkei High Tech. Report 4(1989) No. 7 Feb. 13, 1989.

"Ultrashallow, high doping of boron using molecular layer doping", by Nishizawa; Applied Physics Letters; 56(1990) Apr. 2, No. 14, 1990.

*Primary Examiner*—George Fourson
*Attorney, Agent, or Firm*—Spensley Horn Jubas & Lubitz

[57] ABSTRACT

An exposed active surface is prepared on a major surface of a semiconductor substrate. A source gas containing an impurity component is applied to the exposed active surface to adsorb thereon a film of the impurity component so as to form a barrier region along the major surface of the semiconductor substrate. A semiconductor device is formed on the major surface of the semiconductor substrate and is protected by the barrier region.

8 Claims, 13 Drawing Sheets

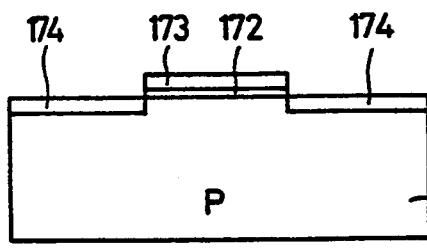
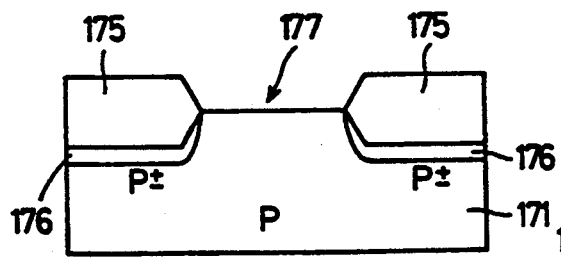
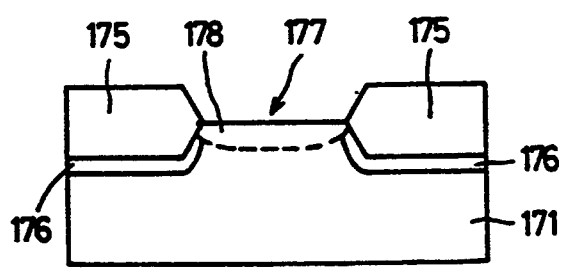
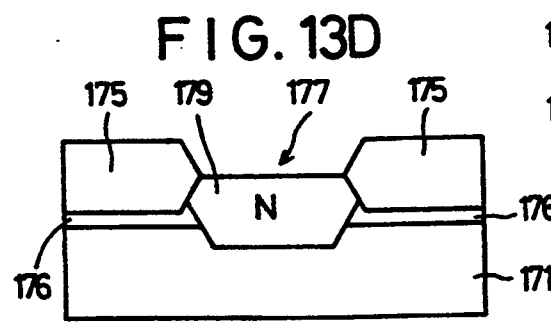
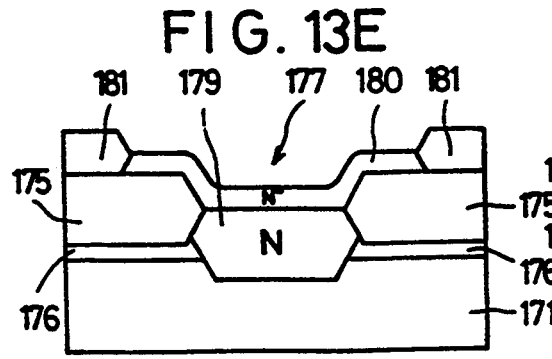
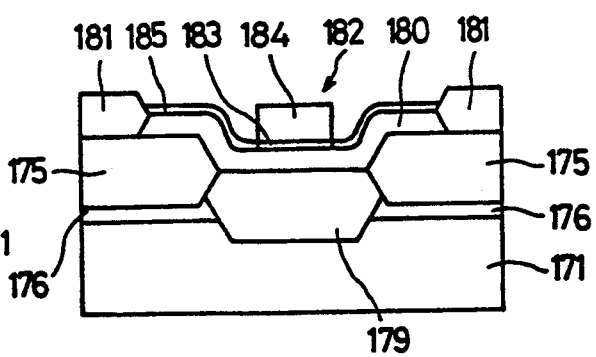
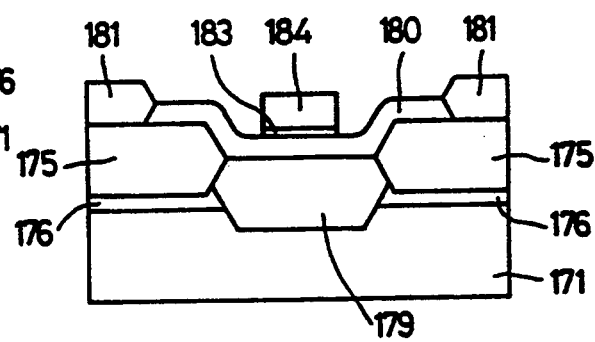
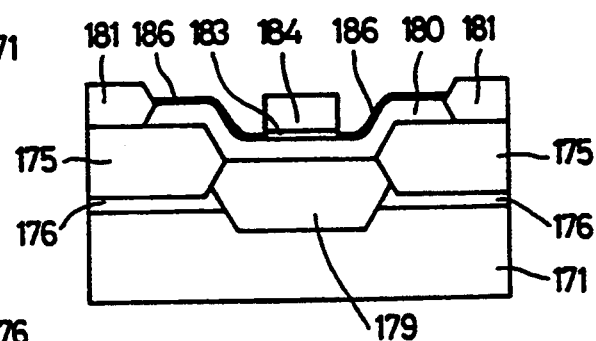
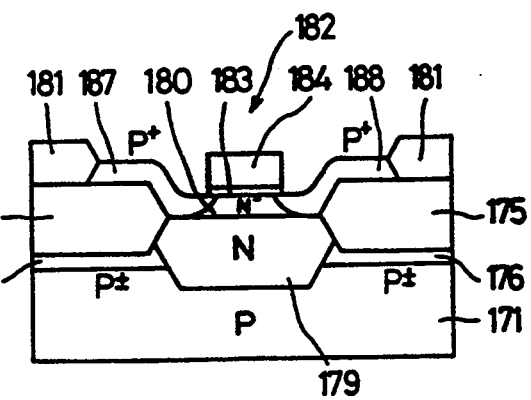

DOPING METHOD OF BARRIER REGION IN SEMICONDUCTOR DEVICE

BACKGROUND OF THE INVENTION

The present invention relates to a method of producing a semiconductor device such as a metal insulator semiconductor field effect transistor (MISFET), and more specifically relates to a method of doping with impurity to form in the semiconductor device various barrier regions such as a field dope layer disposed under a field oxide layer for electrical isolation of an individual device, a channel stopper region disposed under a channel region of a (MISFET) for effectively preventing punch-through or short channel effect in the channel region, and a well region formed in a semiconductor substrate to define a confined and protected device region.

Conventionally, the above noted various barrier regions have been formed by a variety of doping methods in a semiconductor device in the form of a field dope layer, a channel stopper region or a well region so as to protect the semiconductor device.

With regard to field dope layers, this layer is disposed below a field oxide layer. Conventionally, an isolation region is formed by LOCOS technology so as to separate devices formed on a semiconductor integrated circuit. This technology is carried out by forming a field oxide layer composed of a thermally oxidized film along a device isolation region. The field dope layer is interposed under the field oxide layer, in the form of a densely doped impurity layer. This field dope layer is effective to avoid inversion of a semiconductor layer under the field oxide so as to raise the threshold voltage, thereby ensuring electrical isolation of devices from the substrate and electrical separation of adjacent devices. Conventionally, the field dope layer is formed by ion implantation of impurity into the substrate surface, and the field oxide layer is formed by subsequently thermally oxidizing the substrate surface.

However, when using ion implantation, impurity would be introduced through a mask made of silicon nitride and silicon dioxide into a device region surrounded by the device isolation region, thereby causing drawbacks in that the operating characteristics of the device are impaired.

With regard to the channel stopper region, this region is formed in an insulating gate field effect transistor device. The transistor device is composed of a source region and a drain region formed in spaced relation to each other on a surface of a semiconductor substrate, a channel region formed between the source and drain regions, and a gate electrode formed on the channel region and separated from the channel region by a gate insulating film.

With the development of integrated circuit technology, transistor elements become increasingly miniaturized, and the length of the channel region is made shorter and shorter. For this reason, depletion layers positioned at opposite ends of the channel region tend to come close to each other, thereby causing drawbacks such as short channel effect and punch-through. The channel stopper region is provided to prevent the short channel effect and punch-through. The channel stopper region is composed of a heavily doped impurity layer disposed under the channel region so as to avoid expansion of the depletion layers along the channel direction.

However, since the channel stopper region is formed of a highly doped impurity layer disposed under the channel region, its processing is quite difficult and complicated. Therefore, the effective channel stopper region cannot be formed by the conventional ion implantation technology and predeposition diffusion technology. Further, the known channel stopper region is composed of a high density impurity layer containing N type impurity such as arsenic, but there has not been provided a channel stopper region composed of P type high density impurity layer.

With regard to a well region, this is formed in a specific type of the semiconductor device composed of a silicon semiconductor film deposited on a semiconductor substrate by epitaxial growth. Device regions are provided in the silicon semiconductor film. This structure can facilitate integration of semiconductor devices, since device regions are fabricated on the film at a high integration density. Further, the device has high speed operation, since the device is formed in a semiconductor film, or region, having a relatively low impurity concentration with relatively small junction capacitance. When producing such type of semiconductor device, a well region is firstly formed in a surface of the substrate to provide a confined device region isolated from the semiconductor substrate, and a first field oxide film is then formed around the well region.

Next, a silicon semiconductor film is deposited over the first field oxide film. This silicon semiconductor film is partly thermally oxidized to form a second field oxide film, and the remaining part thereof defines the device region just above the previously formed well region.

However, in the above noted prior art, since the well region is provisionally formed in the semiconductor substrate surface prior to the formation of the first field oxide film, drawbacks are presented in that additional steps are needed and the processing is complicated, so that productivity of the device is low. Further, the well region shares a relatively large area dimension in order to achieve good device isolation.

SUMMARY OF THE INVENTION

In view of the above noted drawbacks of the prior art, a general object of the invention is to provide a new method of doping impurities to efficiently form various types of barrier regions, such as a field dope layer, a channel stopper region and a device well region, in a semiconductor device.

A specific object of the invention is to form a field dope layer selectively along a device isolation region to avoid inversion of a semiconductor surface and to prevent a device region from being doped. Another specific object of the invention is to efficiently form a channel stopper region in a MISFET device by a new chemical impurity doping method, and to provide a P type channel stopper region.

A further specific object of the invention is to provide a new method of producing a semiconductor device in which firstly a first field oxide film is formed on a substrate, and then a well region is formed by a new doping technology in a self-aligning manner through a mask composed of the first field oxide film.

According to a first aspect of the invention, a source gas such as diborane containing boron as an impurity component is applied to an active surface or chemically cleaned surface of a silicon substrate so that an impurity layer containing boron is adsorbed on the substrate surface. Then, the silicon substrate surface is thermally selectively oxidized through the adsorbed impurity layer containing a high amount of boron, so that silicon atoms on the substrate surface couple to oxygen atoms in the ambient atmosphere to thereby form a field oxide layer. This field oxide layer grows in the thickness direction of the substrate to push down the impurity layer and concurrently to expand upwardly; hence the downwardly shifted high density impurity layer constitutes an ideal field dope layer. Consequently, there can be formed a device isolation region composed of the field oxide layer and the field dope layer forming a double layer structure.

According to a second aspect of the invention, firstly an oxide coating is removed from a surface of a semiconductor substrate to expose an active surface. A source gas such as diborane containing an impurity component of boron is applied to the exposed active surface on which an impurity layer containing boron as a P type impurity component is adsorbed. This adsorption treatment is carried out while heating the substrate, such that a very stable thin P type impurity layer is formed on the substrate. The thickness of the impurity layer can be optimumly set by controlling the pressure and delivery duration of the source gas. Then, a single crystal semiconductor layer is deposited on the impurity layer by epitaxial growth. Further, a gate electrode is formed on the single crystal semiconductor layer through a gate insulating film. Then, ion implantation is carried out through a mask in the form of the patterned gate electrode to form source and drain regions in the semiconductor layer. In this treatment, the acceleration voltage of ion particles is suitably adjusted so that the ions are implanted in the depth direction to exceed the level of the P type impurity layer. Consequently, a channel region is formed in a portion under the gate electrode, blocked from the irradiation of ions, and the P+ type impurity layer remains under the channel region to provide a channel stopper region.

According to a third aspect of the invention, in the method of producing a semiconductor device having a device region formed of a semiconductor film deposited on a surface of a substrate through a field oxide layer, firstly a field oxide film is formed on the substrate, and thereafter an impurity gas such as diborane is applied through a mask composed of the field oxide film to an active surface of the semiconductor substrate to adsorb on the active surface an impurity film of boron. Solid-phase diffusion occurs from the impurity film into the substrate bulk to thereby form a well region in self-aligned manner. Consequently, the well region can be formed in simple manner to thereby improve the device productivity.

BRIEF DESCRIPTION OF THE DRAWING

FIGS. 13A–13I are views similar to those of FIG. 1 for another embodiment of a method according to the invention for producing MIS field effect film transistor device.

DESCRIPTION OF THE PREFERRED EMBODIMENTS

Hereinafter, various types of preferred embodiments will be described in detail with reference to the attached drawings.

EMBODIMENT 1

FIGS. 1A–1F illustrate an embodiment of a method according to the invention for forming a device isolation region or device separation region in a semiconductor substrate. Firstly, in the FIG. 1A step, a pad oxide film 2 is formed on a silicon substrate 1. The pad oxide film 2 is formed by dry oxidation while heating the substrate at 1000° C. The pad oxide film 2 has a thickness between 100 Å and 300 Å. A silicon nitride film 3 is formed on the pad oxide film 2. The formation of silicon nitride film 3 is carried out by chemical vapor deposition from $NH_3$ and $SiH_2Cl_2$ while heating the substrate in the range from 700° C. to 800° C. The silicon nitride film 3 has a film thickness normally of 1000 Å to 1500 Å.

Figure 1A:
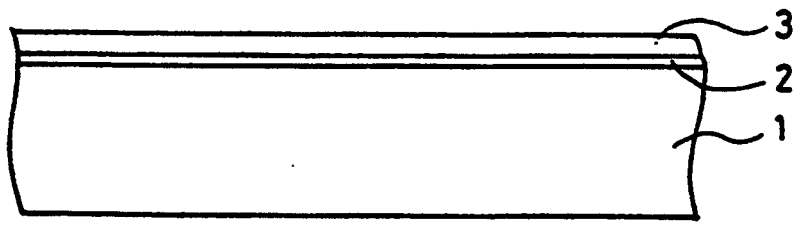
FIGS. 1A–1F are side elevational views illustrating successive steps of a method according to the present invention for forming a device isolation region of a semiconductor device.
Figure 1B:
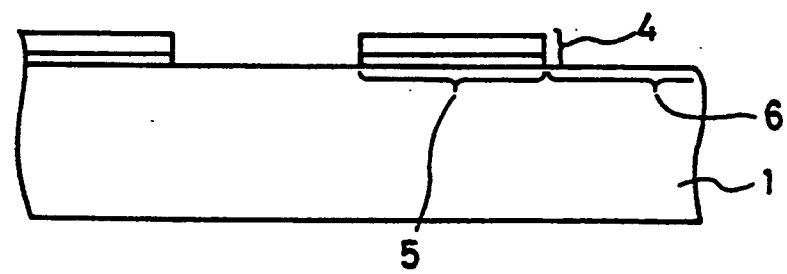

In the FIG. 1B step, the double layer of pad oxide film 2 and silicon nitride film 3 is etched according to a given pattern to provide a mask 4. By this treatment, the substrate surface is divided into a covered region 5 coated by the mask 4 and an uncovered region 6 which is not covered by the mask 4. Then, an inert film such as a naturally occurring oxide film is removed from the substrate surface within the uncovered region 6 to expose an active surface of silicon. This cleaning treatment is carried out by application of a reducing gas such as hydrogen to the substrate surface in a vacuum chamber while heating the substrate.

Figure 1C:
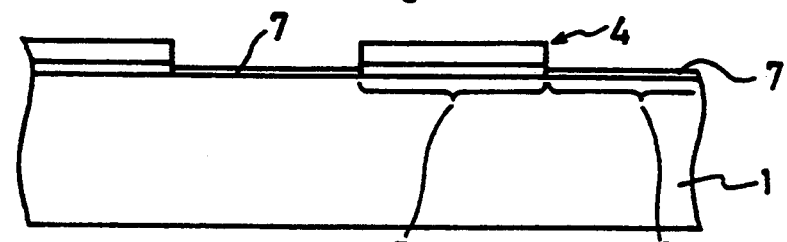

In the FIG. 1C step, a diborane gas ($B_2H_6$) containing boron as an impurity component is applied to the substrate surface to selectively adsorb the impurity component only on the active surface. In this treatment, the substrate 1 is heated, for example, at 800° C. so that the adsorbed diborane is dissociated to form an impurity layer 7 composed of elemental boron. Since the substrate 1 is heated, the boron contained in the impurity layer 7 is partly diffused into the substrate and activated therein. The application of diborane gas is carried out under a high vacuum condition.

Figure 1D:
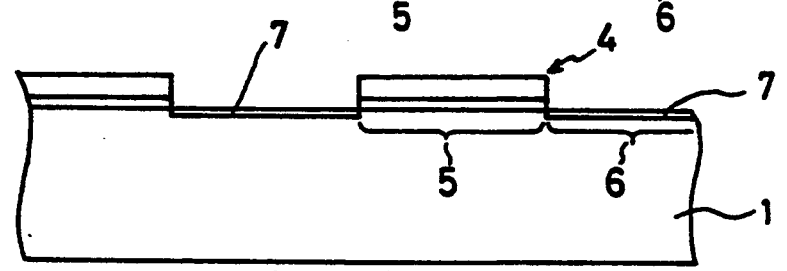

In the FIG. 1D step, the substrate 1 is annealed in an inert ambient gas such as nitrogen so that the boron atoms contained in the impurity layer 7 are further diffused into the substrate 1 and activated. This annealing treatment is not always necessary, but may be carried out if desired.

Figure 1E:
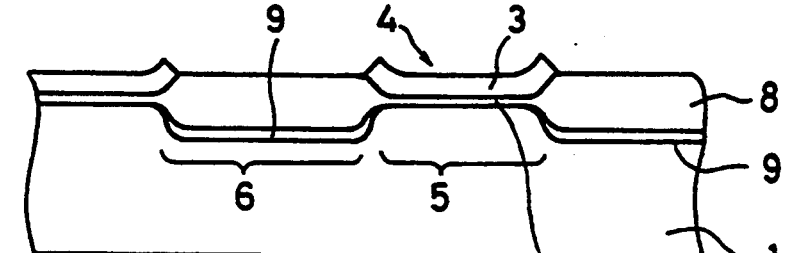

Subsequently, in the FIG. 1E step, a thermal oxidation treatment is effected over the semiconductor substrate. This thermal oxidation is conducted in a wet manner such that oxygen gas and hydrogen gas are concurrently introduced into a chamber while heating the substrate 1 at about 1000° C. in the chamber. This thermal oxidation is carried out selectively through the mask 4 so that the thermal oxidation progresses only within the uncovered region 6. Silicon atoms on the surface of substrate 1 are combined with oxygen atoms in the ambient gas through the impurity layer 7 so as to form a field oxide film 8. In this treatment, the growth of field oxide film 8 progresses downwardly to push down the impurity layer 7 as well as upwardly to expand vertically above the impurity layer 7. Therefore, the impurity layer 7 is shifted downward under the field oxide film 8 to thereby form a field dope layer 9. Consequently, the field dope layer 9 is interposed at a boundary between the field oxide film 8 and the portion of substrate 1 which is still effectively in its initial state. The field dope layer 9 is effective to significantly raise the threshold voltage of a depletion layer at the boundary to perfect the electrical isolation from the substrate.

Figure 1F:
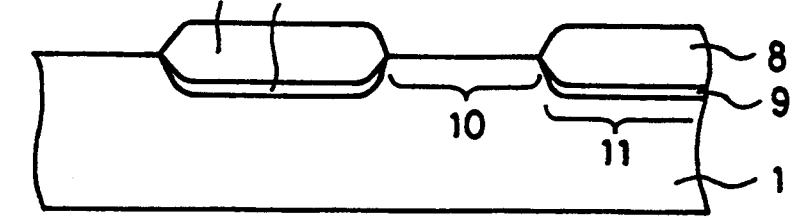

Lastly in the FIG. 1F step, the mask 4 composed of the pad oxide film 2 and silicon nitride film 3 is removed so that the original covered region is converted into a device region 10 in which a device is to be formed. Further, the originally uncovered region 6 is formed with the double layer structure of field oxide film layer 8 and field dope layer 9, which double layer structure constitutes an isolation region 11 surrounding the device region 10. The thermal oxidation progresses not only in the vertical direction of the substrate, but also in the horizontal direction, so that the field oxide film 8 penetrates into edge portion of silicon nitride film 3. Consequently, there is formed a so-called birds-beak such that an effective area of the device region 10 is made smaller than the preset area of the corresponding covered region 5.

As understood from the above description, the inventive method features essentially the sequential steps of cleaning the surface of the substrate 1 to activate the same (FIG. 1B) and adsorbing the impurity layer on the activated surface of the substrate 1 (FIG. 1C) This sequential process will be described hereinbelow in more detail with reference to the drawings.

Figure 2:
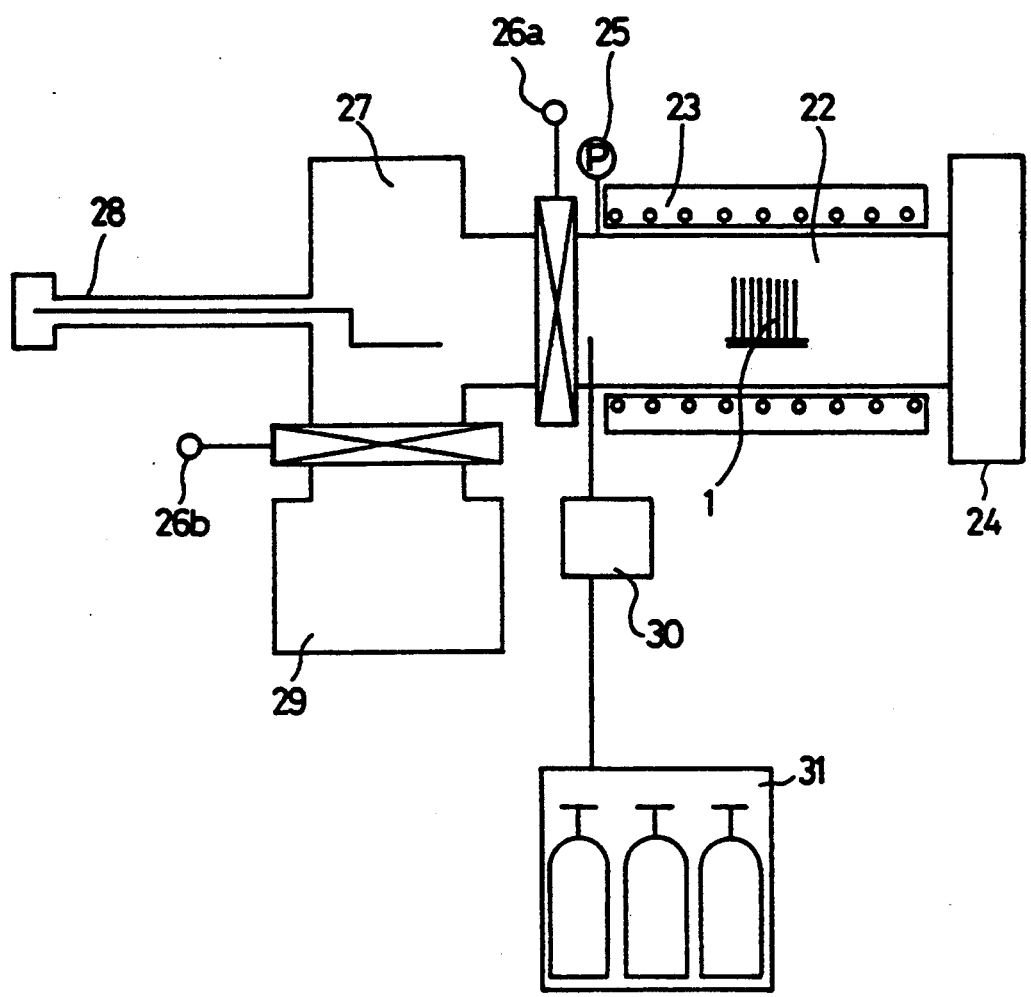
FIG. 2 is a simplified pictorial view of a doping apparatus for use in practicing methods according to the invention.

FIG. 2 shows an apparatus for use in carrying out the above described processing. The apparatus is composed of a vacuum chamber 22 made of quartz in the center of which the silicon substrate 1 is placed. A heating system 23 is provided to control the substrate temperature at a desired level by means of an infrared lamp heater or resistance heater. A high vacuum evacuation system 24 is composed of a plurality of pumps including a main pump in the form of a turbomolecular pump, and is connected to efficiently evacuate the interior of vacuum chamber 22. A pressure gauge 25 is connected to monitor the pressure in chamber 22. A transportation mechanism 28 is provided to transport the silicon substrate 1 to the vacuum chamber 22 from a loading chamber 27 through a gate valve 26a which is held open while during transport. Another vacuum evacuation system 29 is provided to maintain a high vacuum in loading chamber 27 via another gate valve 26b which is opened except during the course of loading and unloading, and transport, of silicon substrate 1. A gas supply source 31 is connected to the vacuum chamber 22 through a gas flow control system 30. The gas supply source 31 includes a plurality of bottles containing various gas species needed for processing. The gas flow control system 30 is operated to control delivery amount, delivery pressure and delivery time duration of gas to chamber 22.

Next, the process doping the silicon substrate with boron will be described in detail with reference to FIG. 2.

Firstly, a cleaning treatment is performed on a surface of the silicon substrate 1. Namely, the silicon substrate 1 is placed in the center of the vacuum chamber 22 which is evacuated to a background pressure or base pressureless than $1 \times 10^{-4}$ Pa. While maintaining the substrate temperature at 850° C., hydrogen gas is introduced from the gas supply source 31 into the chamber 22 so that the pressure in chamber 22 is raised to about $1.3 \times 10^{-2}$ Pa. By this treatment, a natural oxide film is removed from the surface of the silicon substrate 1 to expose a chemically active film surface. The cleaning process is carried out using a reductive hydrogen gas in this embodiment; however, the cleaning or activation may be effected by simple heating of the substrate in vacuum without using the hydrogen gas.

After completing the surface cleaning, the flow of hydrogen gas is stopped and the substrate temperature is lowered to, for example, 800° C. After reaching and stabilizing at that temperature, the silicon substrate 1 is contacted with a diborane gas, which contains boron and which is diluted to a 5% concentration by nitrogen carrier gas, for a given time interval under the condition of a chamber pressure of $1.3 \times 10^{-2}$ Pa. By this treatment, the silicon active surface is coated by an impurity adsorption film containing elemental boron or boron compound. While the elemental boron or boron compound is adsorbed in this treatment, concurrently boron atoms diffuse into the bulk of silicon substrate 1 at a certain rate which is determined by the substrate temperature and diborane gas delivery pressure.

Lastly, the silicon substrate 1 is annealed if necessary. For example, after depositing the impurity layer, the flow of diborane gas is stopped and the substrate is annealed in a vacuum. By this thermal treatment, diffusion of boron impurity is further effected, from a diffusion source composed of the impurity layer, into the silicon substrate and the diffused impurity atoms are activated concurrently. By controlling the annealing conditions such as substrate temperature and heating time, the impurity layer is converted into an impurity diffusion layer having a desired impurity density and diffusion depth.

Figure 3:
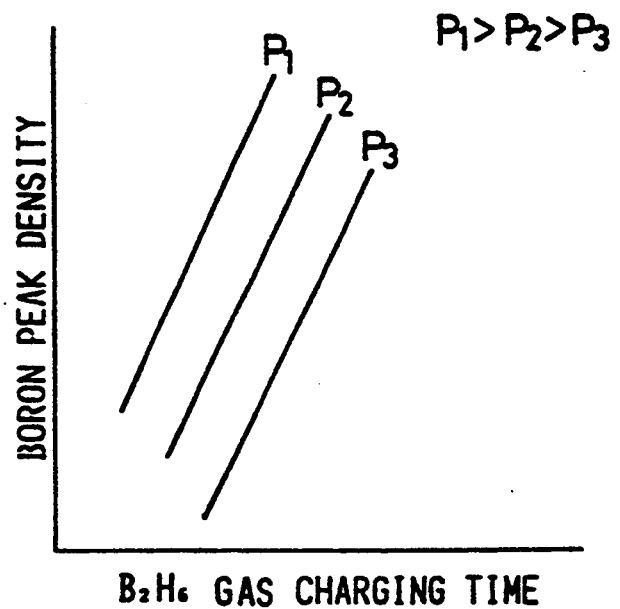
FIG. 3 is a graph showing variation of boron peak density in a field dope layer of a device isolation region.

As shown in graph of FIG. 3, the peak density of the diffused boron is suitably adjusted by controlling the charging, or supply, pressure P1, P2, or P3 of diborane gas and the charging, or gas supply, time. As indicated by the graph, the higher the diborane gas charging pressure and the longer the charging time, the higher the peak density of the diffused boron.

As is apparent from the above description, the inventive method is based on selective formation of an adsorption layer containing an impurity element as a dopant on a chemically active surface of semiconductor material. According to the inventors' detailed studies, it has been found that such adsorption layer is not formed substantially on an insulating film in contrast to an active surface of single crystal semiconductor material or polycrystalline semiconductor material, and the an adsorption layer remains on the insulating film only to a depth of one-tenth or less than that which remains on the active surface. Particularly when adsorbing boron on a silicon substrate, the adsorption amount on a silicon oxide film or a silicon nitride film is far smaller than that adsorbed on the active surface of single crystal silicon. More importantly, the boron adsorption layer on the silicon oxide film or silicon nitride film is more unstable than that deposited on the silicon single crystal substrate during the course of thermal treatment after the formation of an adsorption layer. By utilizing such phenomena, the boron adsorption layer is selectively formed only on an exposed silicon active face through a mask composed of a silicon oxide film and silicon nitride film, effective to avoid diffusion of the impurity.

EMBODIMENT 2

FIGS. 4A–4D show another embodiment for producing a semiconductor device isolation region.

Figure 4A:
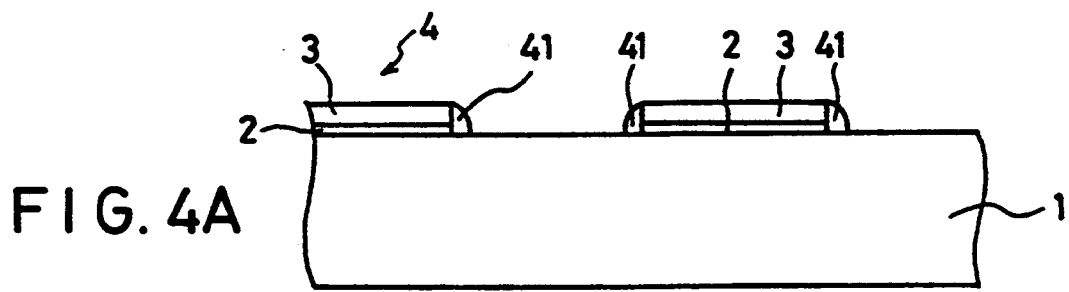
FIGS. 4A–4D are views similar to those of FIG. 1 for an embodiment of a method according to the invention for forming a semiconductor device isolation region.

In the FIG. 4A step, a mask composed of coating 4 having the double layer structure formed by pad oxide film 2 and polysilicon film 3 is etched in a given pattern, and thereafter a side wall 41 composed of oxide is formed around the edge portion of the patterned coating 4. This side wall 41 is formed by chemical vapor deposition of a silicon oxide film and reactive ion etching of the silicon oxide film.

Figure 4B:
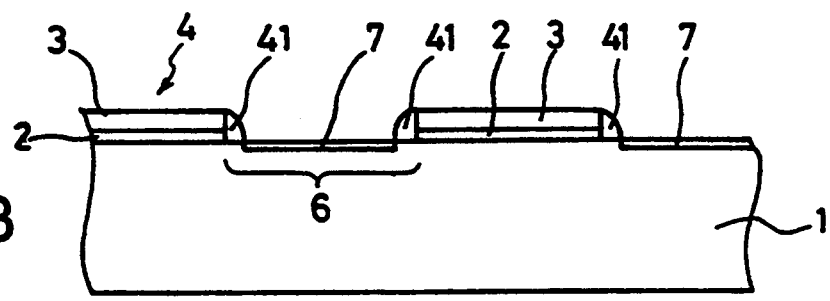

Subsequently, in the FIG. 4B step, the silicon substrate surface is activated within each region 6 which is not covered by the patterned coating 4 and is therefore uncovered, and a boron impurity layer 7 is deposited on the activated surface. This substrate activation or cleaning treatment and the impurity adsorption treatment are carried out in manner similar to that depicted in FIGS. 1A–1F.

Figure 4C:
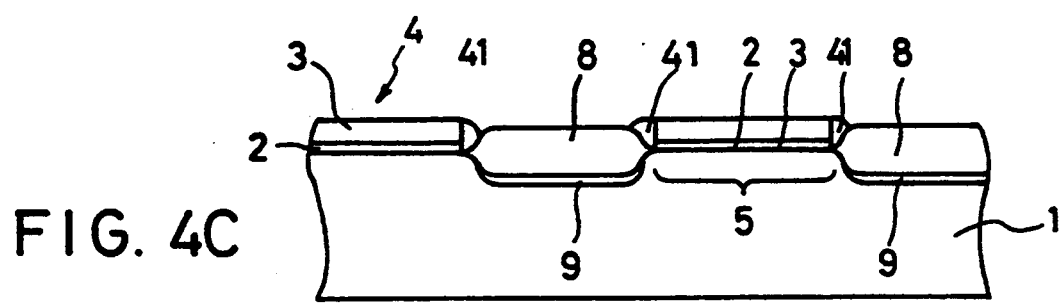

In the FIG. 4C step, selective thermal oxidation is carried out so as to form a field oxide layer 8 on the uncovered region 6. This field oxide layer 8 acts to push down the impurity adsorption layer 7 to form a field dope layer 9. As shown in FIG. 4C, during the course of the formation of field oxide layer 8, the thermal oxidation progresses not only in the vertical or depth direction of the substrate 1, but also in the horizontal direction so that a birds-beak, i.e. edge portion of the field oxide layer 8, penetrates under the sidewall 41.

However, in contrast to the first embodiment, since the side wall 41 is disposed between the masked device region and the impurity adsorption layer, the area of the impurity adsorption layer is smaller than that formed in the first embodiment. Therefore, horizontal drift of the impurity atoms is blocked toward the device region, and does not reach under the coating or mask 4.

Figure 4D:
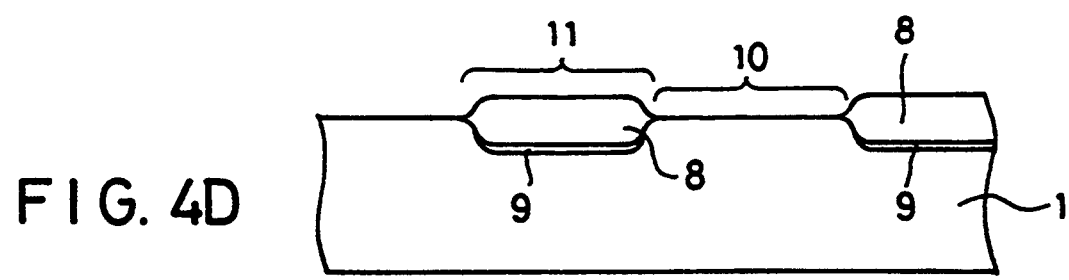

Lastly in the FIG. 4D step, the coating 4 is removed together with the side wall 41 to provide a device region 10. As is apparent from a comparison between the horizontal dimension of field dope layer 9 shown in FIG. 4D and that shown in FIG. 1F, the field dope layer 9 of FIG. 4D extends, advantageously, by a smaller distance toward the device region. Stated otherwise, the side wall 41 is formed in the present embodiment so as to block penetration of the field dope layer 9 into the device region, thereby enabling further reductions in device size.

In the above described embodiments, diborane gas is utilized to form a field dope layer composed of a high density P type impurity region in a silicon substrate. However, the formation of a P type field dope layer can be achieved with other source gases of Group III element compounds such as trimethyl gallium (TMG) or boron trichloride ($BCl_3$). On the other hand, an N type field dope layer can be formed in the silicon semiconductor substrate using various gas compounds such as arsine ($AsH_3$,) phosphorus trichloride ($PCl_3$,) antimony pentachlorids ($SbCl_5$) and phosphine ($PH_3$).

The substrate temperature is set typically at 850° C. for the surface cleaning treatment, and is set typically at 800° C. for the impurity adsorption treatment in the above described embodiments. In general, the substrate temperature is optimumly set in the range from 800° C. to 1200° C. for the surface cleaning treatment in conjunction with appropriate selection of the background pressure and ambient gas species. The substrate temperature is optimumly set in the range from 400° C. to 950° C. for the impurity adsorption treatment.

In the above described embodiments, a boron adsorption layer is directly deposited on an active surface of the silicon substrate. However, a silicon single crystal layer may be provisionally formed as an undertreatment by epitaxial growth. Otherwise, a silicon single crystal layer may be coated on the impurity adsorption layer as an overcoating treatment by epitaxial growth. Further, one or more impurity adsorption layers and epitaxial growth layers may be alternatively superposed so as to form a field dope layer having a desired thickness. Such treatments can facilitate diffusion and activation of the boron impurity.

According to the first aspect of the invention, an impurity adsorption layer is selectively formed only on an active surface of the exposed silicon substrate, and thermal oxidation is conducted through the impurity adsorption layer to form a field oxide layer and a field dope layer. Therefore, a device region surrounded by the device isolation region is not doped by the impurity, thereby effectively providing a device region having excellent electrical and physical characteristics. In addition, the inventive method achieves greater productivity as compared to the conventional method of forming a field dope layer by ion implantation, thereby effectively improving through-put of the production apparatus. Further, the impurity does not pass through the mask, in contrast to conventional methods of using ion implantation.

EMBODIMENT 3

Referring to FIGS. 5A–5G, in this embodiment, firstly an impurity adsorption layer is formed on a surface of a semiconductor substrate, and thereafter an insulating layer is deposited on the impurity adsorption layer. This double layer is removed partly in accordance with a given pattern to provide a device region surrounded by a separation region composed of the remaining double layer. Therefore, the device region has dimensions, and covers an area, exactly in accordance with the given pattern. Further, the impurity adsorption layer is etched away from the device region so that the device region is kept free of impurity doping. In addition, the separation region is composed of the double layer of an insulating film and a field dope film effective to ensure perfect device separation.

Figure 5A:
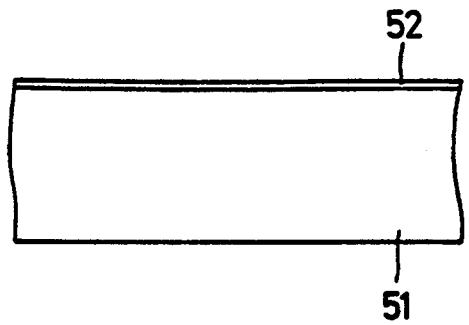
FIGS. 5A–5G are views similar to those of FIG. 1 for another embodiment of a method according to the invention for forming a semiconductor device isolation region.

In the FIG. 5A step, there is prepared a semiconductor substrate 51 on which is to be formed a device separation region. The surface of the semiconductor substrate 51 is normally covered by an inert film 52. When the semiconductor substrate 51 is composed of silicon single crystal, the inert film 52 is generally composed of natural silicon oxide.

Figure 5B:
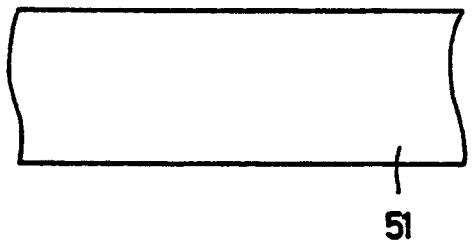

In the FIG. 5B step, the inert film 52 is removed from the surface of the semiconductor substrate 51 to expose an active surface. This treatment is carried out such that the semiconductor substrate 51 is placed under a high vacuum and is heated. Concurrently, a reducing gas such as hydrogen may be introduced to facilitate the removal of the inert film.

Figure 5C:
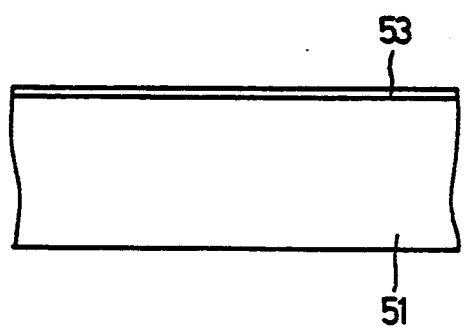

In the FIG. 5C step, a source gas containing an impurity component is applied to the exposed active surface to form an impurity adsorption layer 53 while heating the substrate. This adsorption treatment is carried out such that a diborane gas containing an impurity component of boron is applied to a silicon active surface of the substrate 51 to deposit the impurity adsorption layer 53 containing boron element. The quantity, or content, of the impurity layer 53 is adequately set by adjusting pressure and delivery duration of the applied impurity gas and the substrate temperature.

Figure 5D:
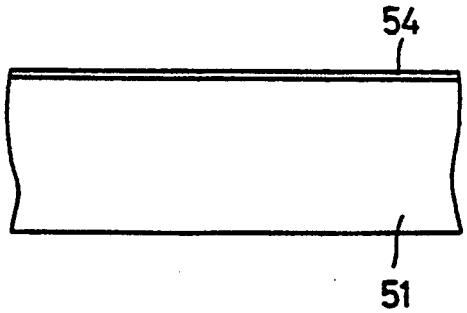

In the FIG. 5D step, the impurity component is diffused in solid-phase from the impurity adsorption layer 53 into the semiconductor substrate 51 to thereby convert the impurity adsorption layer 53 into an impurity diffusion layer 54. When the impurity is composed of boron atoms, the impurity diffusion layer 54 is a P type diffusion region having a relatively high impurity density. Such diffusion treatment can be effected by simply heating the substrate 51. In addition, the diffusion of the impurity would be necessarily caused in succeeding steps even if a particular diffusion step is not added.

Figure 5E:
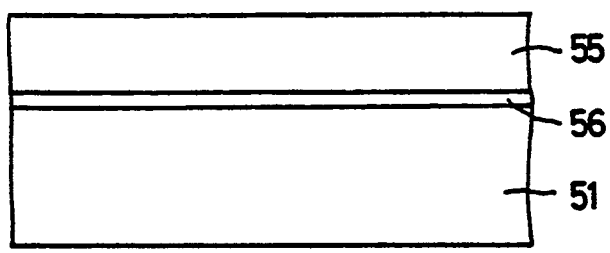

In the FIG. 5E step, an insulating layer 55 is deposited on the impurity diffusion layer 54. The insulating layer 55 is formed by chemical vapor deposition of silicon dioxide. As shown in FIG. 5E, the impurity diffusion layer 54 with high impurity density is interposed, and forms a boundary, between the insulating layer 55 and the semiconductor substrate 51. Consequently, the interposed impurity diffusion layer 54 is effective to prevent inversion of a semiconductor layer in the vicinity of the boundary so as to raise the threshold voltage to thereby function as an efficient field dope layer 56.

Figure 5F:
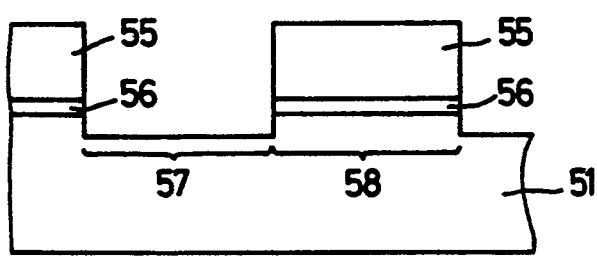

Lastly in the FIG. 5F step, the double layer of insulating film 55 and field dope film 56 is selectively removed according to a predetermined pattern. Consequently, the substrate surface is provided with a device region 57 having an exposed surface of the semiconductor substrate and an isolation region 58 which surrounds the device region 57 and which is covered by the remaining part of the double layer. As shown in FIG. 5F, the device region 57 is formed by etching exactly according to the predetermined pattern to thereby enable efficient use of the substrate surface area. The field dope layer 56 is completely eliminated from the device region 57 by over-etching so as to expose a silicon substrate face which is undoped by the impurity. On the other hand, the isolation region 58 is covered by the insulating layer 55 and the field dope layer 56 to effect perfect device separation.

Figure 5G:
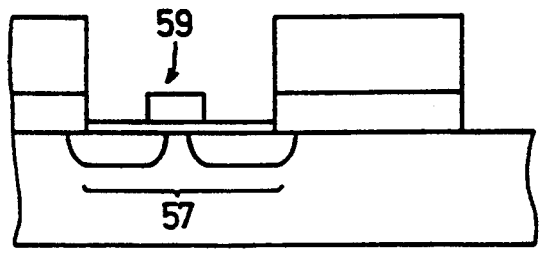

Additionally in the FIG. 5G step, a MISFET device 59 is formed in the device region 57.

Figure 6:
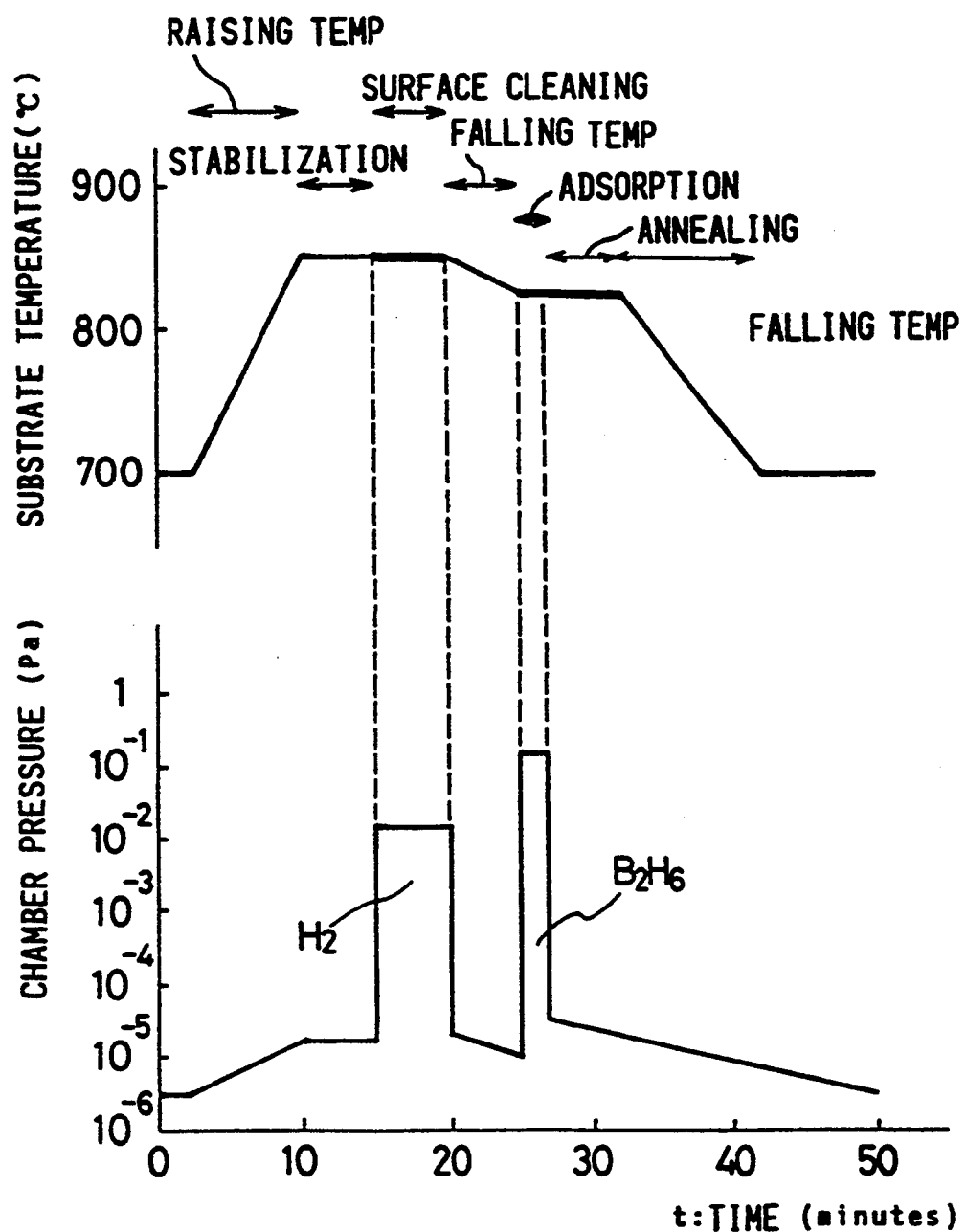
FIG. 6 is a process sequence chart relating to the embodiment of FIG. 5.

FIG. 6 shows a process sequence chart of the above described substrate cleaning step, impurity adsorption step and impurity diffusion step. The horizontal axis indicates processing time and the vertical axis indicates substrate temperature and processing chamber pressure in the chart.

The practical conditions of the sequential steps of cleaning, adsorbing and diffusing will be described in detail with reference to the FIG. 6 chart.

Firstly, the cleaning treatment is applied to a surface of a silicon substrate. Namely, the silicon substrate is placed in a vacuum chamber held at a base pressure of less than $1 \times 10^{-4}$ Pa and the substrate temperature is raised to 850° C. After reaching, and stabilizing at, that set temperature, hydrogen gas is introduced into the vacuum chamber for a given time period such that the chamber pressure is raised to $1.3 \times 10^{-2}$ Pa. By this treatment, a natural oxide film is removed from the surface of the silicon substrate to expose a chemically active silicon surface. The surface cleaning could be effected by simply placing the substrate under a high vacuum while heating even if hydrogen gas is not utilized.

Then, elemental boron or boron compound is adsorbed on the exposed active silicon surface. Namely, after completing the step of cleaning the substrate surface, the delivery of hydrogen gas is stopped and the substrate temperature is lowered slightly to 825° C. After reaching, and stabilizing at, that set temperature, diborane gas containing boron is applied to the active surface of the silicon substrate. The application of diborane is carried out by delivering a source gas, diluted to a concentration of 5% with a nitrogen carrier gas, for a given time period so that the vacuum chamber pressure is raised to $103 \times 10^{-2}$ Pa. By this treatment, there is formed an adsorption layer containing elemental boron or boron compound. Strictly speaking, concurrently with the adsorption of the boron impurity, a part thereof would be diffused into the bulk of the semiconductor substrate at a certain rate determined by the substrate temperature and the supply pressure of the diborane gas.

Lastly, the step of diffusing the boron impurity is carried out if desired. Namely, after adsorbing the impurity layer, the flow of diborane gas is stopped, and the substrate is annealed in a vacuum. Consequently, the solid-phase diffusion of the impurity is effected from a diffusion source composed of the impurity adsorption layer to form the impurity diffusion layer. Concurrently, the diffused impurity atoms are activated in the substrate. In this embodiment, the boron adsorption amount and the annealing conditions, such as substrate heating temperature and substrate heating time, are controlled so as to form an impurity diffusion layer having a desired impurity density and a desired junction depth. The annealing is carried out subsequent to the adsorption of impurity in the same vacuum chamber in this embodiment. Otherwise, the substrate would be taken from the chamber after completing the adsorption of the impurity and then would be subjected to a ramp annealing treatment.

Figure 7:
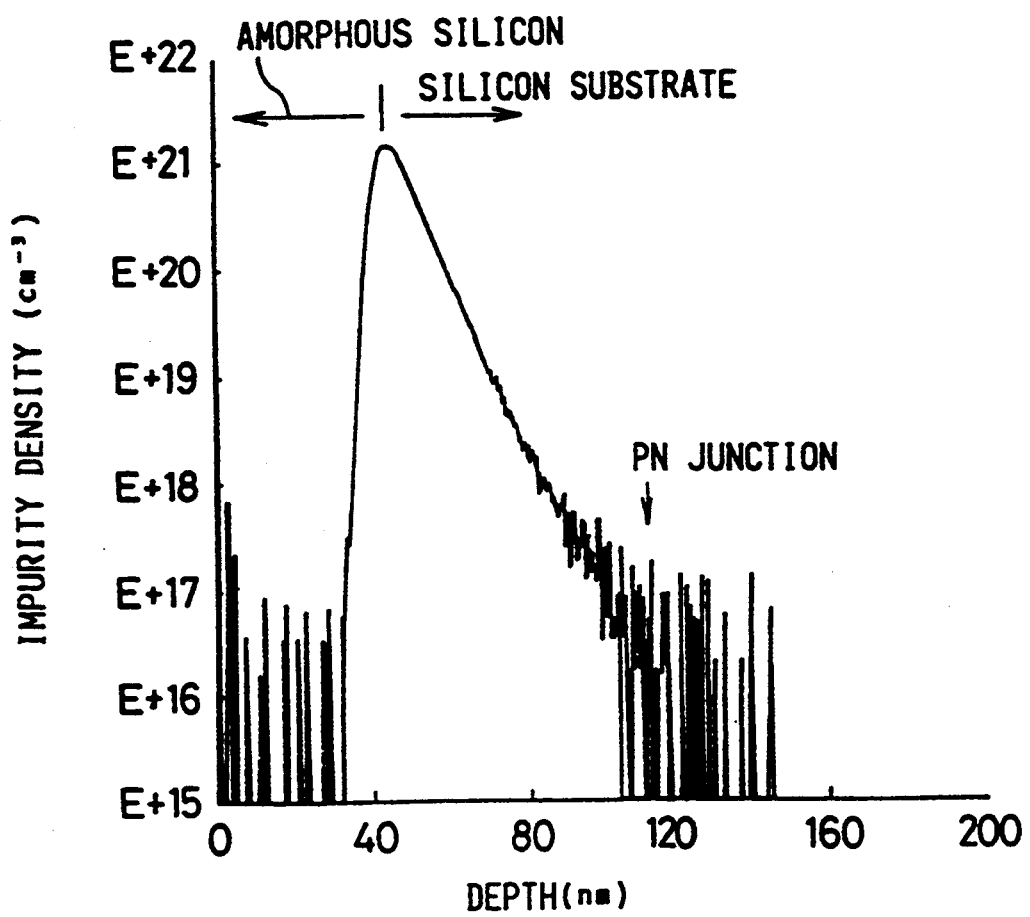
FIG. 7 is a graph showing the impurity density profile of a field dope layer in the device isolation region formed by the method depicted in FIG. 5.

FIG. 7 is a boron density profile, in the depth direction, of a sample produced by the steps of FIG. 5. This boron density profile is obtained by a secondary ion mass spectrometer. The sample is prepared by coating a substrate taken from the vacuum chamber after completing the annealing treatment with an amorphous silicon film having a thickness of about 450 Å at room temperaturein order to improve the analysis sensitivity of the mass spectrometer on the substrate surface. Therefore, the original surface level of the substrate is indicated at about 45 nm along the horizontal axis in the FIG. 7 profile. As apparent from the density profile, the impurity diffusion layer has a depth of about 700 Å in this sample.

As described above, according to the third embodiment, an insulating layer is deposited on an impurity adsorption layer formed on an active surface of a semiconductor substrate so as to derive from the impurity adsorption layer a field dope layer at a boundary between the insulating layer and the semiconductor substrate surface. Then the double layer structure of the insulating layer and the field dope layer is removed selectively according to a given pattern to provide a device region having an exposed substrate surface and a separation region still covered by the remaining part of the double layer. Accordingly, the device region has advantageously the maximum effective area in exact registration with the given pattern. Further, the field dope layer is entirely removed from the device region; hence the device region is advantageously kept free of dopant contained in the field dope layer. Moreover, the field dope layer is disposed below the insulating layer in the separation region, thereby obtaining perfect device isolation or separation effect. Accordingly, the inventive method can facilitate totally further miniaturization of the semiconductor integrated circuit.

EMBODIMENT 4

Referring to FIGS. 8A–8I, this embodiment is directed to a method of forming a MISFET device having a channel stopper region formed according to the new doping technology of the present invention.

Figure 8A:
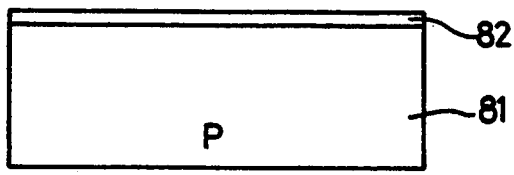
FIGS. 8A–8I are views similar to those of FIG. 1 for an embodiment of a method according to the invention for producing a MISFET device having a channel stopper region.

In the FIG. 8A step, there is provided a silicon single crystal substrate 81 covered normally by a natural oxide film 82.

Figure 8B:
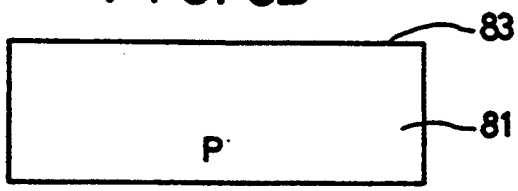

In the FIG. 8B step, the natural oxide film 82 is removed so as to expose an active surface 83 of the silicon single crystal substrate 81. This removal treatment is carried out such that the silicon single crystal substrate 81 is heated at 850° C. and placed in a vacuum chamber held at a pressure of less than $10^{-4}$ Pa. Hydrogen gas may be concurrently introduced to facilitate removal of the natural oxide film 82.

Figure 8C:
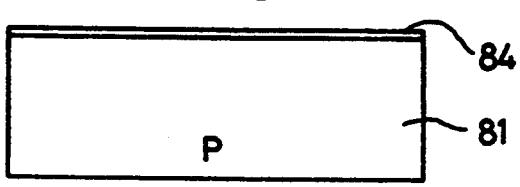

In the FIG. 8C step, a diborane gas is applied to the active surface 83. At this stage, the substrate 81 is heated at 800° C., and a source gas containing diborane diluted to a concentration of 5% by a nitrogen carrier gas is introduced into the chamber for 50 seconds to fill the chamber at a source pressure of $1 \times 10^{-2}$ Pa. Consequently, the active surface 83 of the substrate 81 has deposited thereon a high density P type boron impurity layer 84. The impurity layer 84 has a film thickness of less than 100 Å. The P type impurity layer 84 adheres firmly to the active surface, and the boron atoms are partly diffused into the semiconductor bulk to form a stable impurity diffusion layer since the substrate is heated at a certain temperature.

Figure 8D:
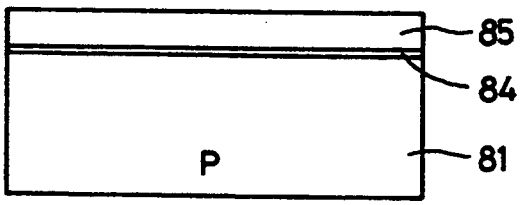

In the FIG. 8D step, a silicon single crystal layer 85 is formed on the P type impurity layer 84. The deposition of the silicon single crystal layer is carried out by an epitaxial growth method so that the silicon single crystal layer grows on the P type impurity layer 84 to a desired thickness. The growth of the silicon single crystal layer 85 is carried out in this embodiment by introducing a silane gas ($SiH_4$) at a supply pressure of 0.1 Pa while heating the substrate at 800° C. Such epitaxial growth can be effected in various ways such as molecular layer epitaxy, molecular beam epitaxy and chemical vapor deposition.

Figure 8E:
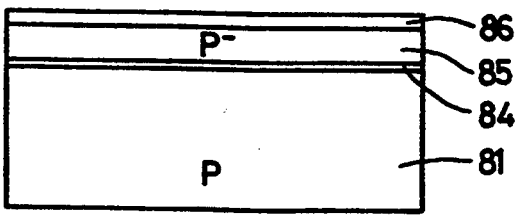

In the FIG. 8E step, a gate oxide film 86 is formed on the silicon single crystal layer 85. The gate oxide film 86 is formed by wet oxidation in that oxygen gas and hydrogen gas are concurrently introduced while heating the substrate 81 at 800° C.

Figure 8F:
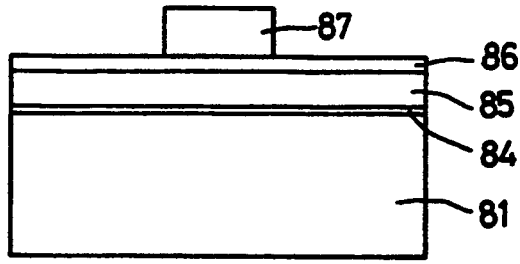

In the FIG. 8F step, a gate electrode 87 is provided on the gate oxide film 86. The gate electrode 87 is formed by deposition of a polysilicon layer over the gate oxide film 86 and followed by etching of the layer according to a given pattern. The polysilicon layer is grown on the gate oxide film 86 to a film thickness 2,000 Å to 4,000 Å by chemical vapor deposition.

Figure 8G:
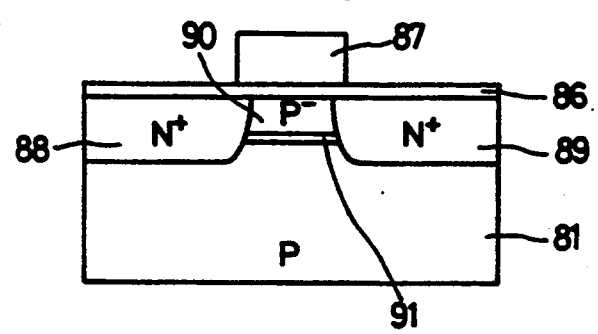

In the FIG. 8G step, a pair of regions constituted by a source region 88 and a drain region 89 are formed in the silicon single crystal layer 85. The formation of these regions is carried out by selectively doping an N type impurity, of arsenic, into a pair of regions separated from one another by a semiconductor region underlying gate electrode 87. The doping with arsenic is effected by ion implantation, under the condition that an acceleration voltage of 90 keV is applied to arsenic ions, and the dose is set to $7 \times 10^{15}$ ions/cm$^2$. This ion implantation is followed by annealing for a given time interval so the the arsenic atoms doping ions reach a certain depth level which is below the horizontal level of the P type impurity layer 84. Consequently, the source and drain regions 88 and 89 are formed by doping with the N type impurity arsenic, and a part of the impurity layer 84 is compensated by the doped N type impurity in the source and drain regions to thereby diminish the impurity density at the level of layer 84. Since the ion implantation of arsenic is carried out by self-alignment procedure using the gate electrode 87 as a mask, a P$^-$ type channel region 90 is formed under the gate electrode 87. Further, the P type impurity layer 84 is kept as it is under the channel region 90 to provide a channel stopper region 91.

Figure 8H:
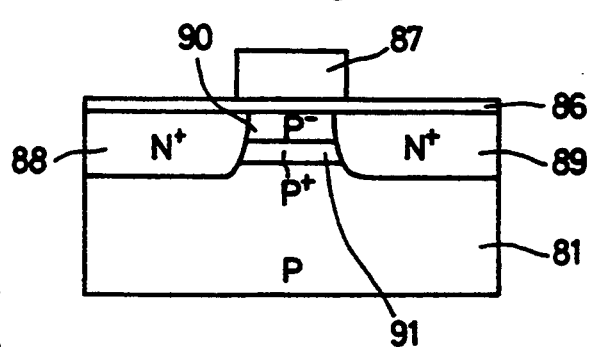

In the FIG. 8H step, the substrate 81 is heated at 900° C. for 30 minutes so that the boron impurity contained in the channel stopper region 91 is diffused upwardly into the upper semiconductor layer 90 and downwardly into substrate 81 and therefore is activated. Consequently, the channel stopper region 91 is turned to a high density impurity diffusion layer of P$^+$ type. By this thermal diffusion treatment, the channel stopper region 91 is expanded so that its thickness is enlarged to a value of between 500 Å and 1,000 Å and the density of the activated boron impurity is changed to $10^{17}$ ions/cm$^3$. This particular thermal diffusion step is not necessary, but the adsorbed boron impurity of P type may be diffused into the upper and lower semiconductor layers to a certain degree since the substrate is subjected to heating in various steps.

Figure 8I:
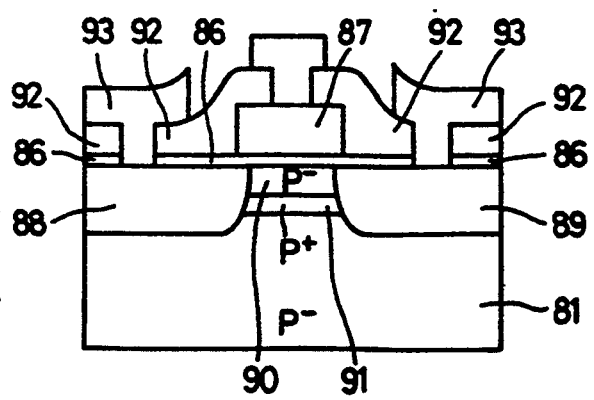

Lastly in the FIG. 8I step, an interlayer insulating film 92 is formed on the substrate 81, and is then etched to provide contact holes. A lead pattern film 93 is formed over the interlayer insulating film 92.

According to this embodiment, the channel stopper region 91 is formed under the channel region in a comparatively simple manner. The channel stopper region is effective to limit the expansion of depletion layers existing at both ends of the channel region to thereby effectively avoid punch-through and short channel effect. Accordingly, the channel length can be shortened as compared to the prior art to enable further scale-down of transistor device dimensions.

Figure 9:
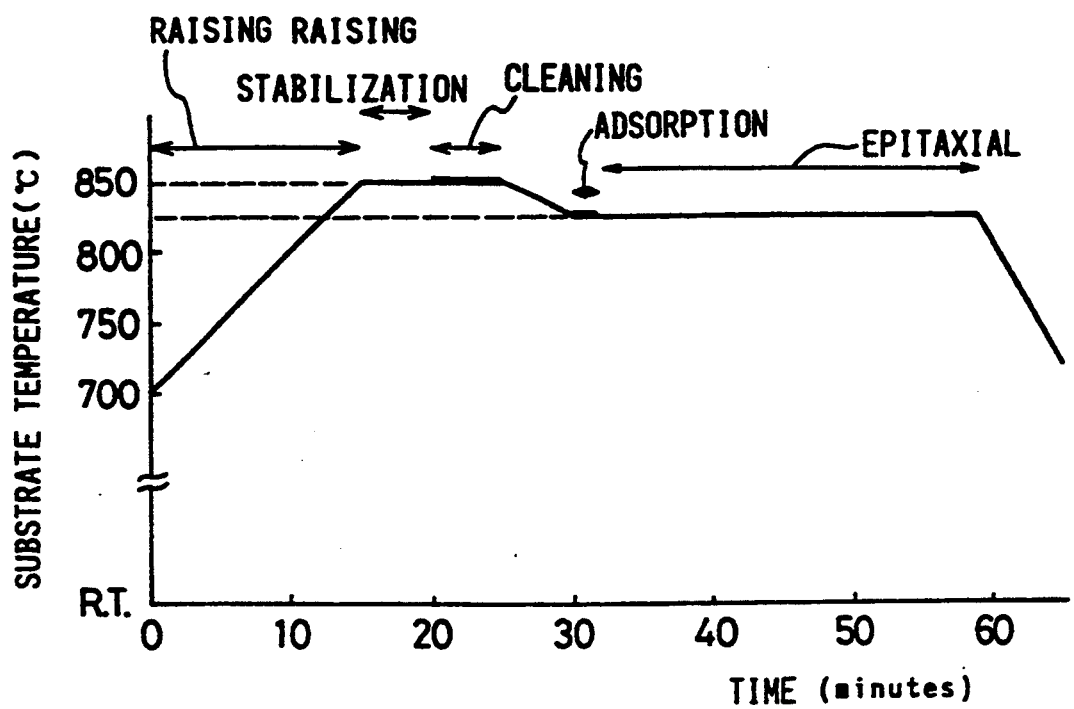
FIG. 9 is a process sequence chart relating to the embodiment of FIG. 8.

As is apparent from the above description, the inventive method is characterized by the sequential steps of cleaning the substrate surface (FIG. 8B,) adsorbing the impurity layer (FIG. 8C) and epitaxially growing the silicon single crystal layer (FIG. 8D). FIG. 9 is an example of an actual process sequence chart for the above-mentioned sequential steps. The horizontal axis indicates processing time and the vertical axis indicates substrate temperature. After the substrate temperature is raised to 850° C., the substrate surface is cleaned to expose an active surface. Then, the substrate temperature is lowered to 800° C. and a diborane gas is introduced to form an impurity adsorption layer of boron.

Subsequently, a silicon single crystal layer is epitaxially grown on the adsorption layer. The epitaxial growth of the silicon single crystal layer is carried out by introducing into the reaction chamber a source gas such as silane ($SiH_4$) or dichlorosilane ($SiH_2Cl_2$) while heating the substrate at 800° C.

EMBODIMENT 5

Referring to FIGS. 10A–10G, this embodiment is for producing a film transistor device on a substrate, having a channel stopper region formed according to the new doping method of this invention.

Figure 10A:
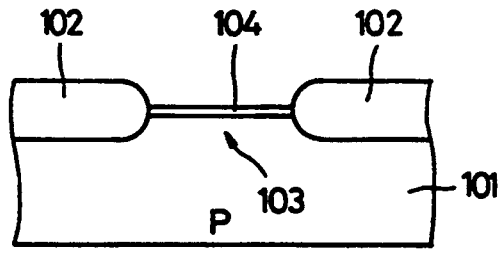
FIGS. 10A–10G are views similar to those of FIG. 1 for another embodiment of a method according to the invention for producing a MISFET device having a channel stopper region.

In the FIG. 10A step, there is provided a silicon substrate 101 of P type. A first field oxide film 102 is formed on the surface of substrate 101 to delimit an active region 103 surrounded by the first field oxide film 102. A surface of the active region 103 is normally covered by a natural oxide film 104.

Figure 10B:
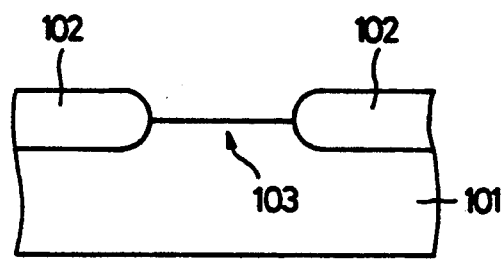

In the FIG. 10B step, the natural oxide film 104, i.e. an inert film, is removed from the active region 103 to expose an active surface of the silicon substrate 101.

Figure 10C:
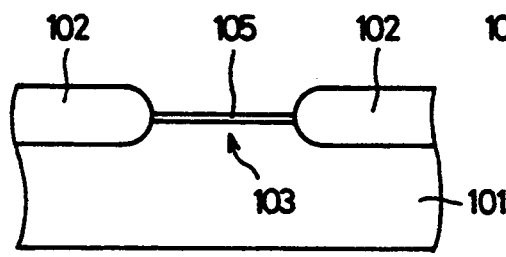

In the FIG. 10C step, a source gas such as diborane containing boron as a P type impurity component is applied to the exposed active face to deposit an adsorption film 105 composed of the boron impurity. This deposition is carried out while heating the substrate 101.

Figure 10D:
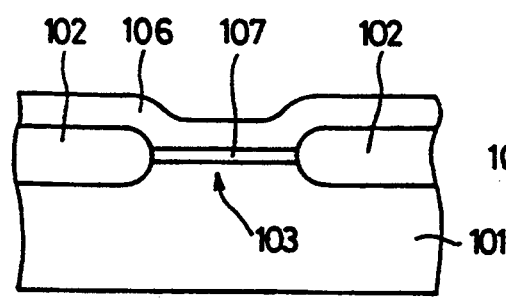

In the FIG. 10D step, a silicon semiconductor layer 106 is deposited over the adsorption film 105 and the first field oxide film 102. Consequently, a channel stopper region 107 is provided by the adsorption film 105 at a boundary between the semiconductor layer 106 and the silicon substrate 101.

Figure 10E:
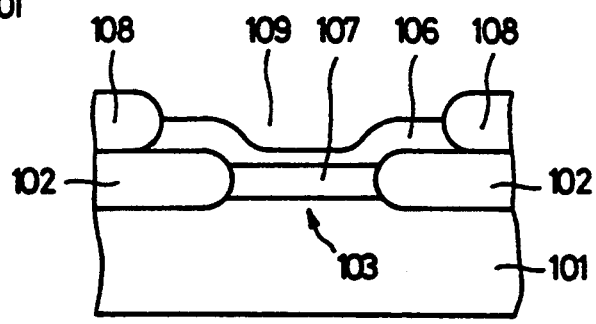

In the FIG. 10E step, the semiconductor layer 106 is selectively thermally oxidized, except at a location above the active region 103 and above a periphery of the first field oxide film 102 which borders the active region 103, to form a second field oxide film 108. Consequently, the remaining portion of the semiconductor layer 106 defines a device region 109. During this treatment for producing the second field oxide film 108, since the substrate 101 is heated, the boron impurity contained in the channel stopper region 107 is further diffused both upwardly and downwardly so that the channel stopper region 107 is broadened in its thickness dimension.

Figure 10F:
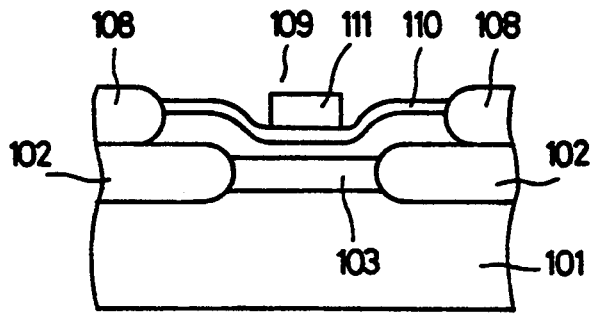

In the FIG. 10F step, a gate insulating film 110 and a gate electrode 111 are successively formed on the device region 109. The gate electrode 111 is patterned in a given shape by photolithography and etching, while the gate insulating film 110 covers the entire surface of the semiconductor layer 106 within the device region 109.

Figure 10G:
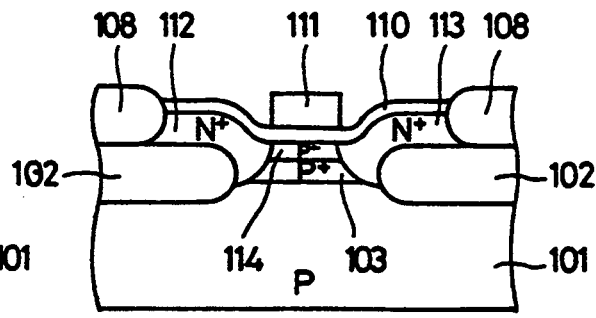

Lastly in the FIG. 10G step, an N type impurity such as arsenic is introduced in a self-alignment manner into the device region 109, using gate electrode 111 as a mask, to form an N+ type source region 112 and an N+ type drain region 113. The introduction of arsenic is carried out by, for example, ion implantation through the gate insulating film 110. Consequently, a channel region 114 is formed under the gate electrode 111 and above the channel stopper region 103 so as to connect between the source region 112 and the drain region 113. By this, there is completed an N channel type insulating gate field effect transistor device having the N+ type source region 112 and the N+ type drain region 113. As shown in FIG. 10G, the channel stopper region 103 is disposed under the channel region 114 so as to suppress expansion of depletion layers in the channel region to effectively avoid punch-through and short channel effect. By such construction, the channel length can be shortened as compared to the prior art to effect further scale-down of transistor dimensions.

EMBODIMENT 6

Referring to FIGS. 11A–11G, this embodiment constitutes one application of the novel doping method according to the invention for formation of drain and source regions on a semiconductor film.

Figure 11A:
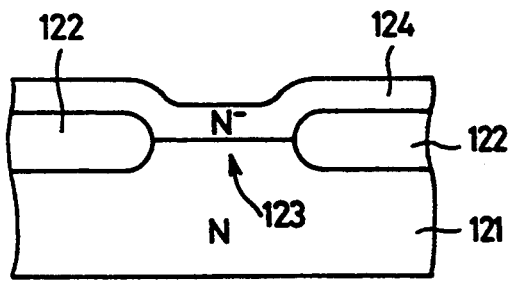
FIGS. 11A–11G are views similar to those of FIG. 1 for another embodiment of a method according to the invention for producing a MISFET device having a channel stopper region.

In the FIG. 11A step, there is prepared a substrate 121 composed of N type silicon. The first field oxide film 122 is formed on the surface of substrate 121 and is shaped according to a predetermined pattern. Further, there is provided on the substrate surface an active region 123 surrounded by the first field oxide film 122. A silicon semiconductor layer 124 is deposited on the active region 123 and the first field oxide film 122. The deposition of silicon semiconductor layer 124 is carried out by reduced pressure epitaxial growth using silane gas ($SiH_4$) and hydrogen gas ($H_2$). The substrate temperature is held at between 800° C. and 1,000° C. during the deposition treatment. Thus, the deposited silicon semiconductor layer 124 has a film thickness of less than 2,000 Å. If the conventional ion implantation were utilized to dope an impurity into such semiconductor layer, the semiconductor layer should have a film thickness more than 2,000 Å in order to obtain an optimum impurity density profile. On the other hand, if the novel impurity doping method according to the invention is utilized, the thickness of the silicon semiconductor layer can be set smaller than was possible in the prior art because the diffusion density profile can be limited to a shallow region. The silicon semiconductor layer 124 is partly turned to N type single crystal over the active region 123, and the remaining part of the silicon semiconductor layer 124 is deposited in the form of polysilicon on the first field oxide film 122.

Figure 11B:
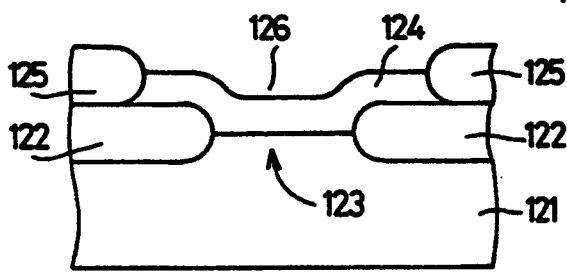

In the FIG. 11B step, the silicon semiconductor layer 124 is selectively thermally oxidized to form a second field oxide film, except at a location disposed over the active region 123 and over a periphery of the first field oxide film 122 which surrounds the active region 123. Consequently, the remaining semiconductor layer 124 defines a device region 126. The device region 126 includes within its border the active region 123 such that the surface area of the substrate 121 is utilized efficiently for device fabrication.

In such structure, the thicknesses of the first and second field oxide films 122 and 125 are greatly reduced so that generation of a birds-beak can be suppressed to significantly improve the degree of integration of the semiconductor device. Further, source and drain 94 regions can be formed on the first field oxide film to thereby reduce junction capacitance.

Figure 11C:
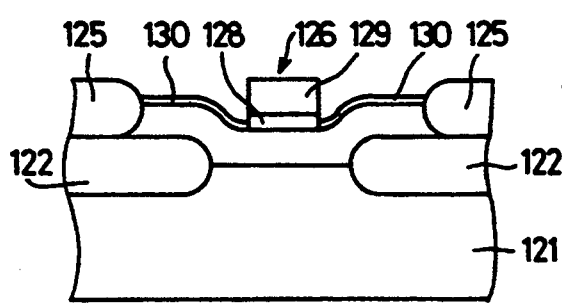

In the FIG. 11C step, a gate insulating film 128 is formed on a surface of the device region 126. The gate insulating film is obtained by oxidizing the surface of semiconductor layer 124 by a wet process. A gate electrode 129 is superposed on the gate insulating film 128. The gate electrode 129 is composed of polysilicon deposited by chemical vapor deposition.

Subsequently, the double layer structure of the gate insulating film 128 and the gate electrode 129 is patterned in a given shape by photolithography and etching. By this treatment, the double layer structure is partly removed to expose a surface of the semiconductor layer 124, which is immediately covered by an inert coating 130, i.e. a natural oxide film of the silicon semiconductor layer.

Figure 11D:
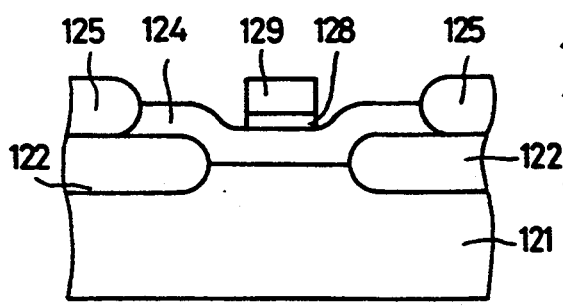

In the FIG. 11D step, the inert coating 130 is removed from the surface of silicon semiconductor layer 124 to expose an active surface of the semiconductor layer. This treatment is carried out by heating the substrate 121 under a high vacuum and in the presence of a reducing gas.

Figure 11E:
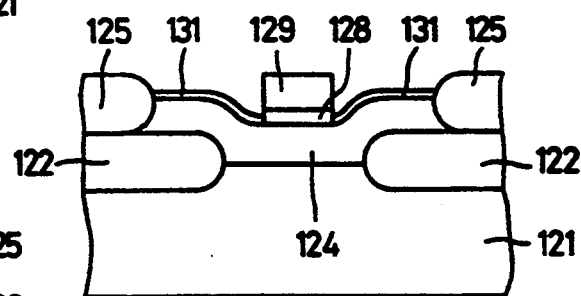

In the FIG. 11E step, the active surface of the semiconductor layer 124 is contacted with a source gas such as diborane containing boron as a P type impurity component so as to form an impurity adsorption film 131 containing the impurity component. This impurity adsorption treatment is effected while heating the substrate. The impurity adsorption film 131 is selectively deposited only on the silicon active surface and is substantially not deposited on the second field oxide film 125. Otherwise, even if a small amount of the impurity remains on the second field oxide film 125, it would be removed by subsequent thermal processe.

Figure 11F:
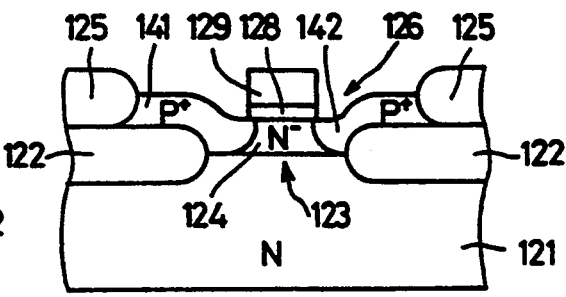

In the FIG. 11F step, the substrate 121 is thermally treated so that solid-phase diffusion of the boron impurity is effected from a diffusion source constituted by the impurity adsorption film 131 into the silicon semiconductor layer 124 to form therein a P+ type source region 141 and a P+ type drain region 142. Thus, the obtained source region 141 and drain region 142 have a small junction capacitance as compared to the prior art. The substrate 121 is thermally treated or annealed in an ambient gas of nitrogen at 900° C. for 30 minutes. By this treatment, a P channel insulating gate field effect transistor is formed on the device region 126.

Figure 11G:
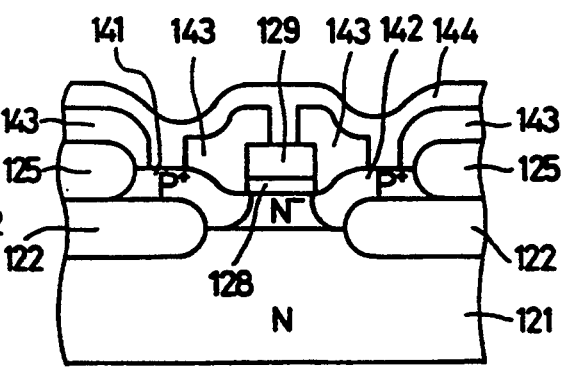

In the last FIG. 11G step, the substrate 121 is coated by an interlayer insulating film 143, and contact holes are formed through the film 143 by etching. This interlayer insulating film 143 is formed by chemical vapor deposition of PSG. A lead pattern film 144 is formed over the interlayer insulating film 144.

In summary, a semiconductor layer is deposited on a semiconductor substrate to provide a device region. An impurity is adsorbed selectively on an exposed active face of the semiconductor layer, and is then thermally diffused to form a source region and a drain region. The diffusion density profile is limited in a shallow portion by controlling the impurity adsorption amount and diffusion conditions such as heating temperature and time, thereby reducing the junction depth of the diffusion layer and the junction capacitance to thereby achieve speed operativity of the MISFET device.

EMBODIMENT 7

Referring to FIG. 12A–12F, this embodiment is a method of forming a well region in a semiconductor substrate by using the new doping technology according to the present invention.

Figure 12A:
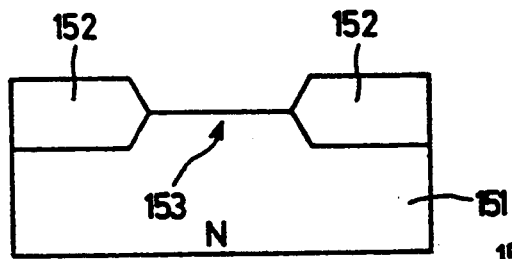
FIGS. 12A–12F are views similar to those of FIG. 1 for an embodiment of a method according to the invention for forming a MIS field effect film transistor device having a well region.

In the FIG. 12A step, there is prepared a silicon substrate 151 of N type which is formed with a first field oxide film 152 by selective thermal oxidation to delimit a window portion 153.

Figure 12B:
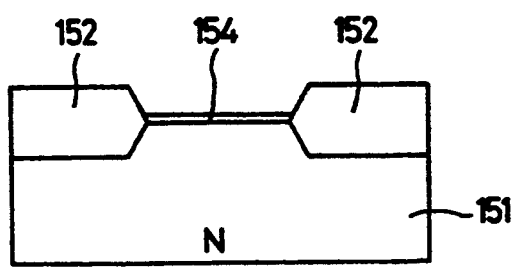

In the FIG. 12B step, an inert film is removed from the window portion 153 to expose an active surface of the silicon substrate 151. Diborane gas is applied to the exposed active face while heating the substrate 151 to deposit an impurity film 154 containing boron. This boron impurity film 154 has a specific affinity effective to selectively adsorb on the silicon active surface, hence it is essentially not deposited over the first field oxide film 152.

Figure 12C:
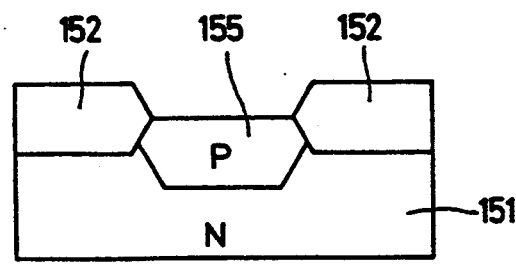

In the FIG. 12C step, the substrate 151 is annealed so that solid-phase diffusion of boron is effected from a diffusion source of the impurity film 154 into the bulk of the semiconductor substrate 151 to form therein a P type well region 155. In this embodiment, the well region is formed after the formation of the first field oxide film 152, and is formed in a self-alignment manner through a mask of the first field film 152 as shown in FIG. 12C. The diffusion depth of P type well region 155 is adjusted by controlling the boron adsorption amount contained in the impurity adsorption film. The boron adsorption amount is regulated by controlling the substrate temperature and pressure and the length of time the diborane gas is delivered.

Figure 12D:
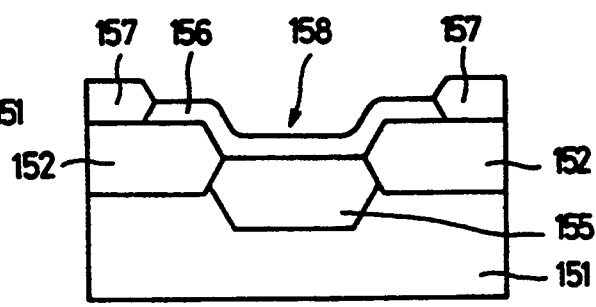

In the FIG. 12D step, a silicon semiconductor film 156 is deposited to cover continuously the P type well region 155 and the first field oxide film 152. Then, the silicon semiconductor film 156 is partly thermally oxidized to form a second field oxide film 157. This selective thermal oxidation is carried out through a mask to leave a portion of the silicon semiconductor film 156 arranged on the P type well region and on a periphery of the first field oxide film 152 which surrounds the P type well region. Consequently, the portion of the silicon semiconductor film 156 which is left defines a device region 158. The device region 158 extends over the periphery of the first field oxide film 152 to enable efficient use of the substrate surface area.

Figure 12E:
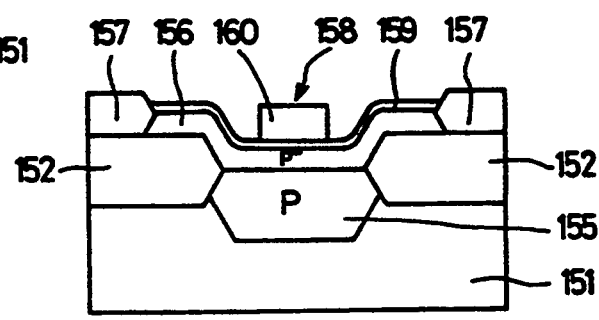

In the FIG. 12E step, a gate insulating film 159 is formed on the entire surface of the device region 158. A gate electrode 160 is deposited on the gate insulating film 159, and is patterned in a given shape on a central portion of the device region 158.

Figure 12F:
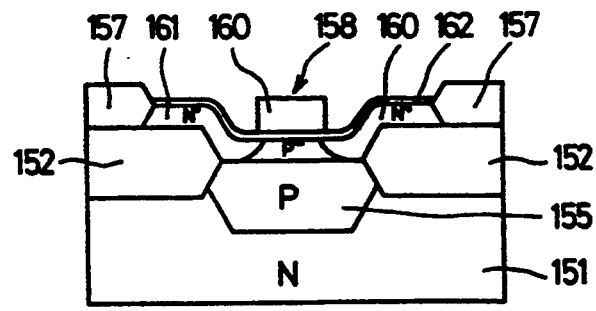

Lastly, in the FIG. 12F step, an N type impurity of arsenic is doped into the silicon semiconductor film 156 to form N+ type source and drain regions 161 and 162 by ion implantation, thereby completing an N type MISFET device. The doping with arsenic as the impurity is carried out through the gate insulating film 159, using gate electrode 160 and second field oxide film 157 as a mask.

As described above, in this embodiment, a first field oxide film is formed on a surface of a silicon substrate, and thereafter an impurity is doped limitatively into the substrate in a self-alignment manner through a mask of the first field oxide film so as to form a barrier region in the form of a well region. Therefore, the processing to form the well region is simplified as compared to the prior art, thereby significantly improving productivity of semiconductor devices. Further, the dimension of the well region can be reduced as compared to the prior art to shorten processing time for formation of the well region.

EMBODIMENT 8

An alternative variation of the seventh embodiment is described with reference to FIGS. 13A–13I.

In the FIG. 13A step, there is provided a silicon semiconductor substrate 171 of P type. Then, a surface of the substrate 171 is coated partly by a shield film which has double layer structure composed of a pad oxide film 172 and a silicon nitride film 173. Further, a P type impurity of boron is doped into the surface of substrate 171, using the shield film as a mask. so that a P type impurity layer 174 is formed on the exposed surface areas of substrate 171.

In the FIG. 13B step, selective thermal oxidation is carried out on the substrate surface around the shield film mask to form a first field oxide film 175. This selective thermal oxidation progresses by capturing oxygen atoms from an ambient gas so that the first field oxide film 175 is formed to grow over the P type impurity layer 174. Therefore, the P type impurity layer 174 is resultingly disposed at a boundary between the first field oxide film 175 and the substrate 171 so as to form a P type field dope layer 176. The field dope layer 176 is effective to raise the threshold voltage, according to the invention, in a semiconductor layer positioned in the vicinity of the boundary between the first field oxide film 175 and the substrate 171 to ensure perfect device isolation. Subsequently, the shield film mask is removed to provide a window portion 177 surrounded by the first field oxide film 175.

In the FIG. 13C step, an N type impurity is doped into the substrate 171 through the window portion 177 to form an N type impurity layer 178. The formation of the impurity layer 178 is carried out by ion implantation to introduce arsenic or phosphorus into a shallow portion of the substrate bulk. Namely, the N type impurity layer 178 is formed in a self-alignment manner through a mask of the first field oxide film 175.

In the FIG. 13D step, the substrate 171 is heated to effect an annealing treatment. The impurity such as arsenic contained at a high density in the N type impurity layer 178 is diffused by this heating in the depth direction of the substrate 171 to form an N type well region 179. As apparent from FIG. 13D, the N type well region 179 is confined compactly as compared to the prior art.

In the FIG. 13E step, a semiconductor film 180 is deposited to cover the window portion 177 and the first field oxide film 175. The deposition of this film 180 is carried out by reduced-pressure chemical vapor deposition using silane gas and hydrogen gas at the substrate temperature of 800° C. through 1,000° C. The silicon semiconductor film 180 is composed of $N^-$ type single crystal silicon on the N type well region 179 and is also differently composed of polysilicon on the first field oxide film 175. Subsequently, the silicon semiconductor film 180 is selectively thermally oxidized to form a second field oxide film 181. This selective thermal oxidation is carried out to preclude oxidation of a part of the silicon semiconductor film 180 located on the window portion 177 and on a periphery of the first field oxide film 175 which is continuous to the window portion 177. Therefore, the precluded portion of the semiconductor film 180 defines a device region. As shown in FIG. 13E, the device region extends over the periphery of first field oxide film 175, and the thickness of first field oxide film 175 can be reduced as compared to the prior art. Therefore, generation of a birds-beak can be suppressed to facilitate efficient use of the semiconductor surface area.

In the FIG. 13F step, a gate insulating film 183 and a gate electrode 184 are successively formed on a central portion of the device region 182. In this state, a peripheral portion of the semiconductor film 180 is coated by an inert film 185 composed of a natural silicon oxide film.

In the FIG. 13G step, the inert film 185 is removed to expose an active surface of the silicon semiconductor film 180. This activation treatment is carried out by introducing a reducing gas into a vacuum chamber in which the substrate 171 is heated.

In the FIG. 13H step, an impurity adsorption film 186 is deposited on the active surface. This impurity adsorption treatment is carried out by applying a diborane gas containing an impurity component of boron to the heated substrate 171 to deposit an adsorption film containing the impurity component boron.

Lastly in the FIG. 13I step, the substrate 171 is annealed so as to effect solid-phase diffusion of boron from a diffusion source composed of the impurity adsorption film 186 to thereby form a source region 187 and a drain region 188 in the semiconductor film 180. The source and drain regions are $P^+$ type regions each containing a high concentration of the boron impurity. Accordingly, there can be produced a P type insulating gate field effect transistor in the device region 182.

This application relates to subject matter disclosed in Japanese Application Numbers 1-313719, 1-313720, 1-313726, filed Dec. 1, 1989, and 1-318553, and 1-318554 filed Dec. 6, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing a field effect transistor comprising:
    first step for removing an oxide film from a first semiconductor layer of a first conductivity type to expose an active surface;
    second step for applying a gas containing an impurity component of the first conductivity type to the active surface so that an impurity layer containing the impurity component of the first conductivity type is adsorbed at the active surface;
    third step for depositing a second semiconductor layer on the impurity layer;

fourth step for forming sequentially a gate insulating film and a gate electrode on the deposited second semiconductor layer; and fifth step for introducing another impurity component of a second conductivity type selectively through a pair of regions divided by the gate electrode from each other into the semiconductor layers in a certain depth level below a horizontal level of the impurity layer to form a pair of source and drain regions so that a channel region is provided in the second semiconductor layer between the source and drain regions while a channel stopper region composed of the impurity layer of the first conductivity is arranged under the channel region.

2. A method according to claim 1; including a step of diffusing the impurity component from the impurity layer into the lower first semiconductor layer and the upper second semiconductor layer and activating the impurity component.

3. A method according to claim 1 wherein the first semiconductor layer is a silicon substrate, the first conductivity type is P type, and the second step comprises applying diborane gas to the active surface of the silicon substrate while heating the substrate to form an impurity layer of boron.

4. A method according to claim 3 wherein the second semiconductor layer is composed of epitaxially grown silicon.

5. A method according to claim 3 wherein the second semiconductor layer is silicon of P conductivity type, and the fifth step comprises introducing an N type impurity of arsenic into the silicon substrate and the second semiconductor layer by ion implantation to form an N type source region and an N type drain region.

6. A method of producing a Metal Insulator semiconductor field effect transistor, comprising:

first step for forming an active region surrounded by a first field oxide film on a surface of a semiconductor substrate of a first conductivity type;

second step for removing an inert coating from the active region to expose an active surface of the semiconductor substrate;

third step for applying a gas containing an impurity component of the first conductivity type to the active surface to form an adsorption film containing the impurity component of the first conductivity type on the active surface;

fourth step for depositing a semiconductor layer on the adsorption film and the first field oxide film so as to form a channel stopper region composed of an impurity diffusion layer of the first conductivity type produced from the adsorption film at a boundary region between the semiconductor layer and the semiconductor substrate;

fifth step for selectively thermally oxidizing the semiconductor layer except a portion disposed on the active region and on a periphery of the first field oxide film which surrounds the active region to form a second field oxide film to thereby provide a device region composed of the remaining portion of the semiconductor layer;

sixth step for successively forming a gate insulating film and a gate electrode on the device region; and seventh step for introducing another impurity component of a second conductivity type through a mask of the gate electrode into the device region to form source and drain regions of the second conductivity type to thereby provide a channel region connecting between the source and drain regions under the gate electrode and above the channel stopper region.

7. A method according to claim 6 wherein the third step comprises applying diborane gas to an active surface of a P type silicon substrate to form an adsorption film containing boron.

8. A method of producing a semiconductor device on a semiconductor substrate, comprising steps of:

exposing an active surface to define a device region;

applying a gas containing an impurity component to the exposed active surface to form an adsorbed impurity component film containing the impurity component at the active surface;

diffusing the impurity component of the adsorbed impurity component film into the active surface;

depositing a semiconductor layer to provide a channel region on the adsorbed impurity component film; and forming a transistor device to provide a barrier region between the channel region and the semiconductor substrate within the device region so that the barrier region functions as a channel stopper region.

* * * * *